United States Patent
Chou (10) Patent No.: US 7,142,043 B2
(45) Date of Patent: Nov. 28, 2006

(54) ON CHIP WORD LINE VOLTAGE WITH PVT TRACKING FOR MEMORY EMBEDDED IN LOGIC PROCESS

(75) Inventor: Chung-Cheng Chou, Hsinchu (TW)

(73) Assignee: Taiwan Semiconductor Manufacturing Co., Ltd. (TW)

( * ) Notice: Subject to any disclaimer, the term of this patent is extended or adjusted under 35 U.S.C. 154(b) by 81 days.

(21) Appl. No.: 10/909,729

(22) Filed: Aug. 2, 2004

(65) Prior Publication Data

US 2006/0022743 A1    Feb. 2, 2006

(51) Int. Cl.
    *G05F 1/10*    (2006.01)
(52) U.S. Cl. ..................................... 327/538
(58) Field of Classification Search ............. 327/512, 327/513, 534, 535, 536, 538, 543
    See application file for complete search history.

(56) References Cited

U.S. PATENT DOCUMENTS 5,889,664 A * 3/1999 Oh .............................. 363/60
6,147,914 A   11/2000 Leung et al.
6,498,737 B1 * 12/2002 Kuo ............................ 363/59

OTHER PUBLICATIONS

Markus Mergens et al., "Application of an ESD-MOS Compact Model for IC Design", 7 pages.

* cited by examiner

*Primary Examiner*—Jeffrey Zweizig
(74) *Attorney, Agent, or Firm*—Duane Morris LLP

(57) ABSTRACT

The present disclosure is directed toward regulation of voltage for semiconductor memories. In an embodiment, a circuit for providing a controlled voltage level comprises a PMOS transistor coupled to a first voltage coupler ($V_{PP}$), the gate of the PMOS transistor being coupled to the drain of the PMOS transistor; a MOS sub-threshold current source, coupled to a second voltage coupler (ground); and a bias independent current source coupled to the MOS sub-threshold current source and the PMOS transistor intermediate the MOS sub-threshold current source and the PMOS transistor. It is emphasized that this abstract is provided to comply with the rules requiring an abstract which will allow a searcher or other reader to quickly ascertain the subject matter of the technical disclosure. It is submitted with the understanding that it will not be used to interpret or limit the scope or meaning of the claims.

16 Claims, 6 Drawing Sheets

PRIOR ART

ON CHIP WORD LINE VOLTAGE WITH PVT TRACKING FOR MEMORY EMBEDDED IN LOGIC PROCESS

FIELD

The present disclosure relates generally to regulation of voltage for semiconductor devices.

BACKGROUND

Variances in process, temperature, and/or voltage may affect operational characteristics of the circuits fabricated by the processing. Prior art methods and circuits often use negative and positive temperature effect current sources to bias a detection circuit to ameliorate variances caused by process used, temperature, and/or voltage variations. This, however, often focuses only on temperature compensation and/or on voltage tracking. Often a bipolar device is used to generate a positive temperature effect current source.

In the described examples, the positive supply voltage is designated as supply voltage $V_{DD}$ and the ground supply voltage, having a nominal value of 0 Volts is designated as supply voltage $V_{SS}$.

Figures 1, 2:
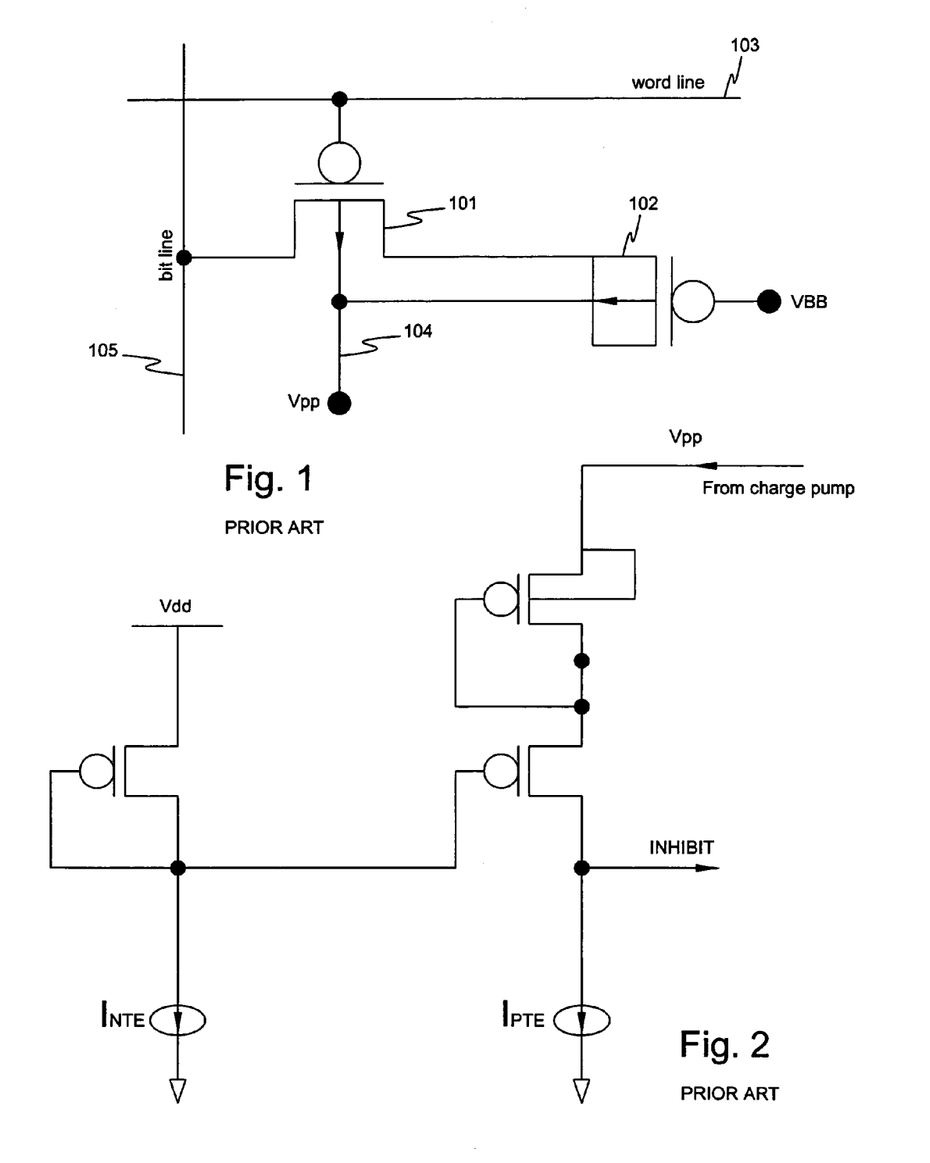
FIG. 1 is a schematic diagram of a prior art DRAM memory cell.
FIG. 2 is a schematic diagram of a prior art $V_{PP}$ detection circuit.

FIG. 1 is a representation of a prior art DRAM memory cell. The memory cell includes a p-channel access transistor 101 and a p-channel storage transistor 102 that is configured as a storage capacitor. The gate of the access transistor 101 is connected to word line 103 and the drain of the access transistor 101 is connected to the bit line 105. The source of access transistor 101 is coupled to the source region of transistor 102. The gate of transistor 102 is connected to receive a negative boosted bias voltage $V_{BB}$. The Bias voltage $V_{BB}$ is limited by the break down voltage of the gate oxide of capacitor 102 and the highest voltage stored on the electrode. In general, bias voltage $V_{BB}$ is set to a voltage that is greater V1 minus Vbd. In general V1 is equal to the positive supply voltage $V_{DD}$. N-well is biased to a boosted positive voltage $V_{PP}$ that is greater than the $V_{DD}$ supply voltage by a voltage that is approximately equal to the absolute value of the threshold voltage of p-channel access transistor 101.

Certain voltage levels, e.g. $V_{PP}$, need to be at desired levels in order for the circuit (FIG. 1, for example) to work correctly. $V_{PP}$ needs to be at a level that will turn off a transfer gate well, $V_{BB}$ needs to be deep enough to turn on transfer gates, and so on. However, at fast corner processing, for example, or at high temperature, threshold voltages may shrink, meaning a gate may be turned on with a shallower voltage $V_{BB}$ but may need a greater voltage $V_{PP}$ to turn off the gate. The inverse may be true at slow corner processing. Therefore, $V_{PP}$ often needs to track $V_{DD}$ variations, e.g. maintain a constant voltage differential.

Table 1 is an example of desired $V_{PP}$ and $V_{BB}$ levels for variation in operations, temperature vs. baseline conditions which reflect the events above.

TABLE 1

| Conditions | Desired $V_{PP}$ | Desired $V_{BB}$ |
|---|---|---|
| Baseline @ 25° C., $V_{DD}$ | $V_{PP}$ Process | $V_{BB}$ |
| Slow corner | Decrease $V_{PP}$ | Increase $V_{BB}$ |
| Fast corner | Increase $V_{PP}$ | Decrease $V_{BB}$ |

TABLE 1-continued

| Conditions | Desired $V_{PP}$ | Desired $V_{BB}$ |
|---|---|---|
| Temperature | | |
| @ 125° C. | Increase $V_{PP}$ | Decrease $V_{BB}$ |
| @ −40° C. | Decrease $V_{PP}$ | Increase $V_{BB}$ |
| Supply Voltage | | |
| +20% $V_{DD}$ | +20% $V_{DD}$ | $V_{BB}$ |
| −20% $V_{DD}$ | −20% $V_{DD}$ | $V_{BB}$ |

A problem with the prior art is that the methods and circuits used to compensate for process-voltage-temperature (PVT) variations cannot reflect real world demands placed in word line voltage in the existence of process variations. For example, the prior art methods and circuits cannot work for a low voltage process because of the numerous components, e.g. two MOS transistors, a resistor, and a bipolar transistor connected in series between $V_{DD}$ and $V_{SS}$ voltage sources for positive temperature effect current source.

Figure 3A:
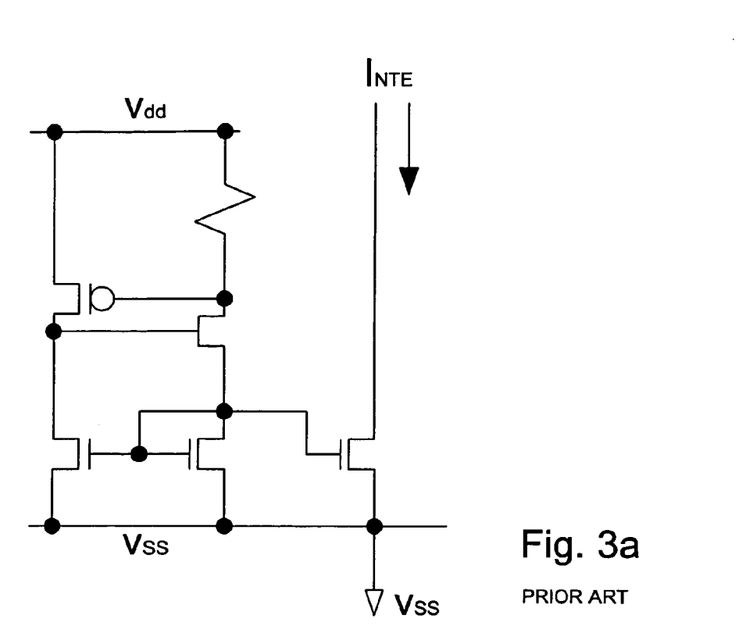
FIG. 3a is a schematic diagram of a prior art $I_{NTE}$ current source.
Figure 3B:
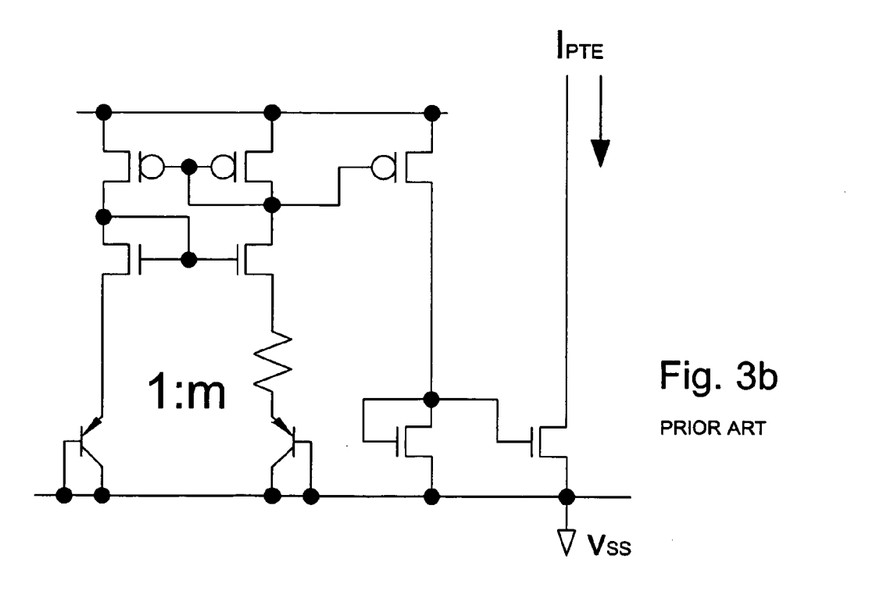
FIG. 3b is a schematic diagram of a prior art $I_{PTE}$ current source.
Figure 4:
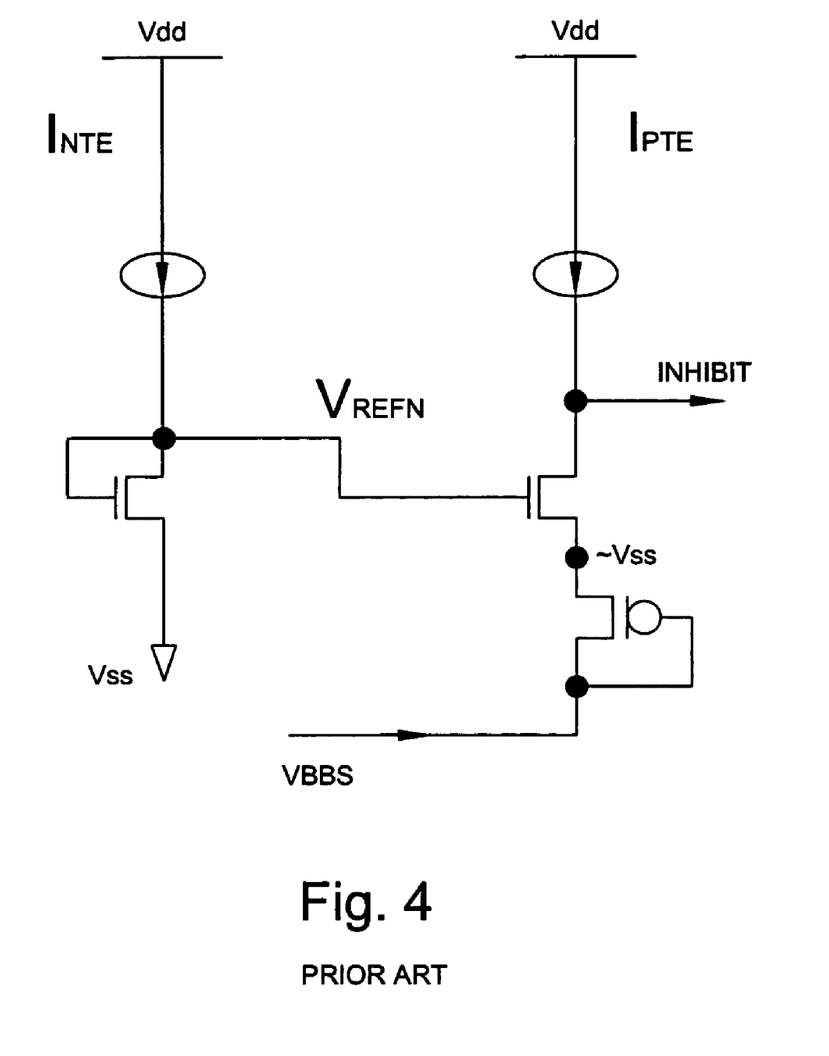
FIG. 4 is a schematic diagram of a prior art $V_{BB}$ detection circuit.

Further, often the prior art maintains voltages at set levels, e.g. $V_{PP}=V_{DD}+|V_{TP}|$ and $V_{BB}=V_{SS}-|V_{TP}|$. If the threshold voltage $V_{TP}$ becomes small, such as from environmental changes, off-currents may increase due to a smaller turn off voltage operated in a leaky condition. FIGS. 2 through 4 are representative of prior art solutions.

FIG. 2 is a prior art $V_{PP}$ detection circuit which uses $I_{NTE}$ and $I_{PTE}$ current sources. FIGS. 3a and 3b are prior art current sources associated with prior art solutions, such as shown in FIGS. 2 and 4. FIG. 3a shows a prior art circuit for $I_{NTE}$ and FIG. 3b shows a prior art circuit for $I_{PTE}$ where $I_{NTE}=|V_{TP}|/R$ is negative and $I_{PTE}=kT/q \times Ln(m)$ is positive. FIG. 4 is a prior art $V_{BB}$ detection circuit. These prior art solutions use negative and positive temperature effect currents sources to bias the detection circuit and only focus on temperature and voltage tracking and thus cannot reflect the real demand on word line voltage from process variations.

Therefore in order to obviate the deficiencies in the prior art, it is an object of the present disclosure to provide a circuit that provides desirables word line voltage levels $V_{PP}$ and $V_{BB}$ over P.V.T variations.

These objects and other advantages of the disclosed subject matter will be readily apparent to one skilled in the art to which the disclosure pertains from a perusal or the claims, the appended drawings, and the following detailed description of the preferred embodiments.

DETAILED DESCRIPTION OF EMBODIMENTS OF THE PRESENT DISCLOSURE

Figure 5:
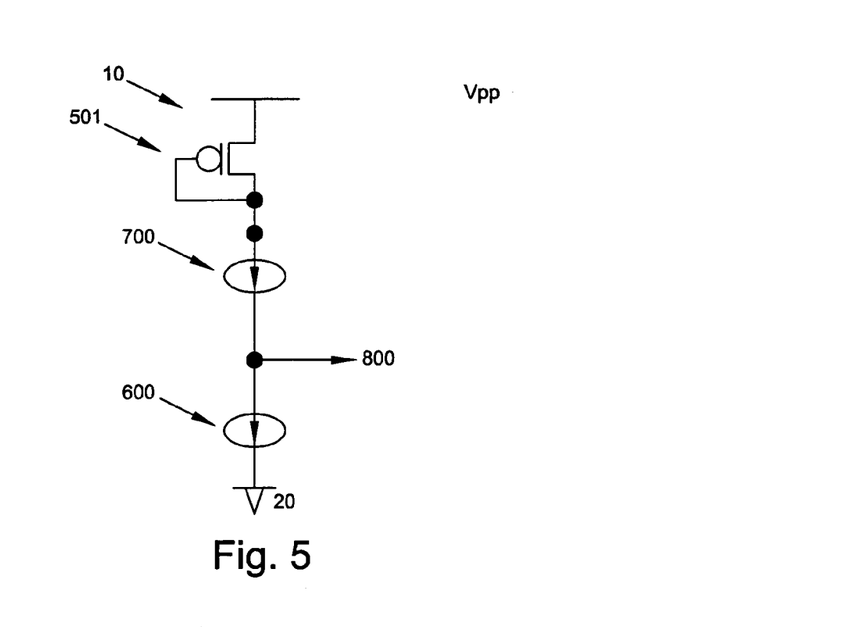
FIG. 5 is a schematic diagram of a $V_{PP}$ detection circuit according to an embodiment of the present disclosure.

Referring now to FIG. 5, in a preferred embodiment a circuit for providing a controlled voltage level may comprise PMOS transistor 501 coupled to voltage coupler 10; MOS sub-threshold current source 600 coupled to voltage coupler 20; and bias independent current source 700 coupled to MOS sub-threshold current source 600 and PMOS transistor 501 intermediate MOS sub-threshold current source 600 and PMOS transistor 501.

Additionally, an inhibit coupler 800 may be provided intermediate to the bias independent source 700 and source 600. In this embodiment, the voltage source coupled to voltage coupler 10 may be allowed to be compensated to rise in response to a rise in sub-threshold current $I_{sbt}$. The voltage source to be compensated, e.g. $V_{PP}$, may also be allowed to fall in response to a fall in sub-threshold current $I_{sbt}$. Inhibit coupler 800 may be used to provide a reference signal to detect a value of the voltage at the voltage source to be compensated, e.g. $V_{PP}$. For example, a high value at inhibit coupler 800 may be used to indicate that the voltage at the voltage source to be compensated has reached a desired value.

The gate of PMOS transistor 501 may be coupled to the drain of PMOS transistor 501.

In a preferred embodiment, voltage coupler 10 may be adapted to be coupled to a source of $V_{PP}$ voltage and voltage coupler 20 may be adapted to be coupled to ground.

MOS sub-threshold current source 600 may further comprise a source of ppc current, $I_{ppc}$. $I_{ppc}$ denotes the positive temperature current source of $V_{PP}$ and $I_{bbc}$ denotes the positive temperature current source for $V_{BB}$. $I_{ppc}$ comprises two components, a bias independent current source $I_{ref}$ and a MOS saturation current source $I_{sat}$, such that $I_{ppc}$=C1 $I_{ref}$ +C2 $I_{sat}$, where C1 and C2 are real numbers.

Figure 6:
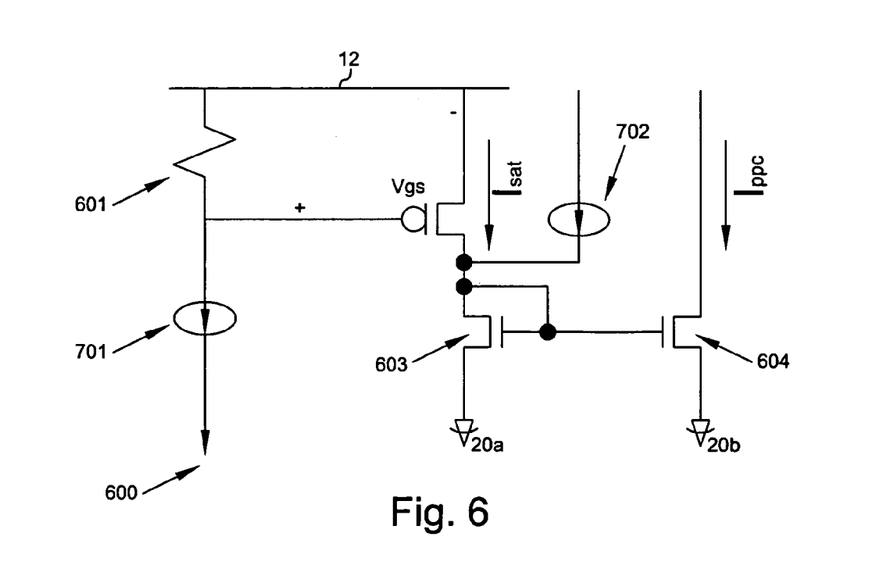
FIG. 6 is a schematic diagram of a MOS sub-threshold current source according to an embodiment of the present disclosure.

Referring now to FIG. 6 which is an embodiment of an MOS sub threshold current source 600. MOS sub-threshold current source 600 may further comprise voltage coupler 12; a resistor 601 having a first terminal coupled to voltage coupler 12 and a second terminal; a bias independent current source 701 coupled to the second terminal of resistor 601; PMOS transistor 602, the source of which is coupled to voltage coupler 12 and the gate of which is coupled to the second terminal of resistor 601; a bias independent current source 702 coupled to the drain of PMOS transistor 601; NMOS transistor 603, the drain of which is coupled to the drain of PMOS transistor 602 and to the gate of NMOS transistor 603 and the source of which is coupled to voltage coupler 20a; and NMOS transistor 604, the gate of which is coupled to the gate of NMOS transistor 603, the source of which is coupled to voltage coupler 20d, and the drain of which is coupled to a source of $I_{ppc}$ current.

In a preferred embodiment, voltage coupler 12 is adapted to couple to a source of $V_{DD}$ voltage and voltage couplers 20a and 20b are adapted to couple to ground.

Figure 7:
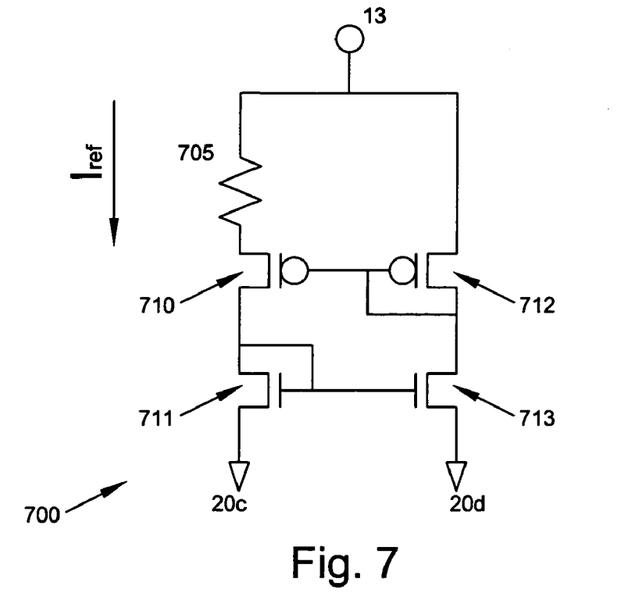
FIG. 7 is a schematic diagram of a bias independent current source according to an embodiment of the present disclosure.

Referring now to FIG. 7, preferably, each bias independent current source 700, e.g. 701 and 702 (FIG. 6), further comprise voltage coupler 13; reference resistor 705, comprising a first terminal coupled to voltage coupler 13 and a second terminal; PMOS transistor 710, the source of which is coupled to the second terminal of reference resistor 705; PMOS transistor 712, the gate of which is coupled to the gate of PMOS transistor 710 and to the drain of PMOS transistor 712 and the source of which is coupled to voltage coupler 13; NMOS transistor 711, the drain and gate of which are coupled to the drain of PMOS transistor 710 and the source of which is coupled to voltage coupler 20c; and NMOS transistor 713, the drain of which is coupled to the drain of PMOS transistor 712, the gate of which is coupled to the gate of NMOS transistor 711, and the source of which is coupled to voltage coupler 20d.

Voltage coupler 13 may be coupled to a source of $V_{DD}$ voltage and voltage couplers 20c and 20d may be coupled to ground.

Bias independent current source 700 may further comprise first coupling terminal VDD and a second coupling terminal. First coupling terminal may be coupled to the drain of PMOS transistor 501 and the second coupling terminal may be coupled to the MOS sub-threshold current source.

Figure 8:
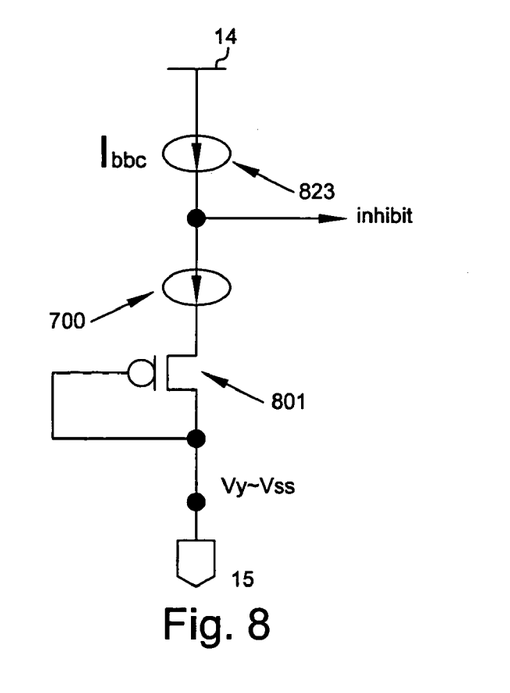
FIG. 8 is a schematic diagram of a $V_{BB}$ detection circuit according to an embodiment of the present disclosure.

Referring now to FIG. 8, which is an embodiment of a $V_{BB}$ detection circuit. The $V_{BB}$ detection circuit may comprise first voltage source (not shown in the figure), comprising a first terminal, coupled to the first voltage source at voltage coupler 14, and a second terminal; bias independent current source 700, comprising a first terminal coupled to the second terminal of the current source $I_{bbc}$ and a second terminal; and PMOS transistor 801, the source of which is coupled to the second terminal of bias independent current source 700, the gate of which is coupled to the drain, and the drain of which is coupled to voltage source 15. $I_{bbc}$ is a combination of I ref and I sat such that $I_{bbc}$=D1 $I_{ref}$+D2 $I_{sat}$, where D1 and D2 are real numbers that can be selected.

First voltage source may be a source of $V_{DD}$ voltage and voltage source 15 may be coupled to a source of $V_{BB}$ voltage.

Figure 9:
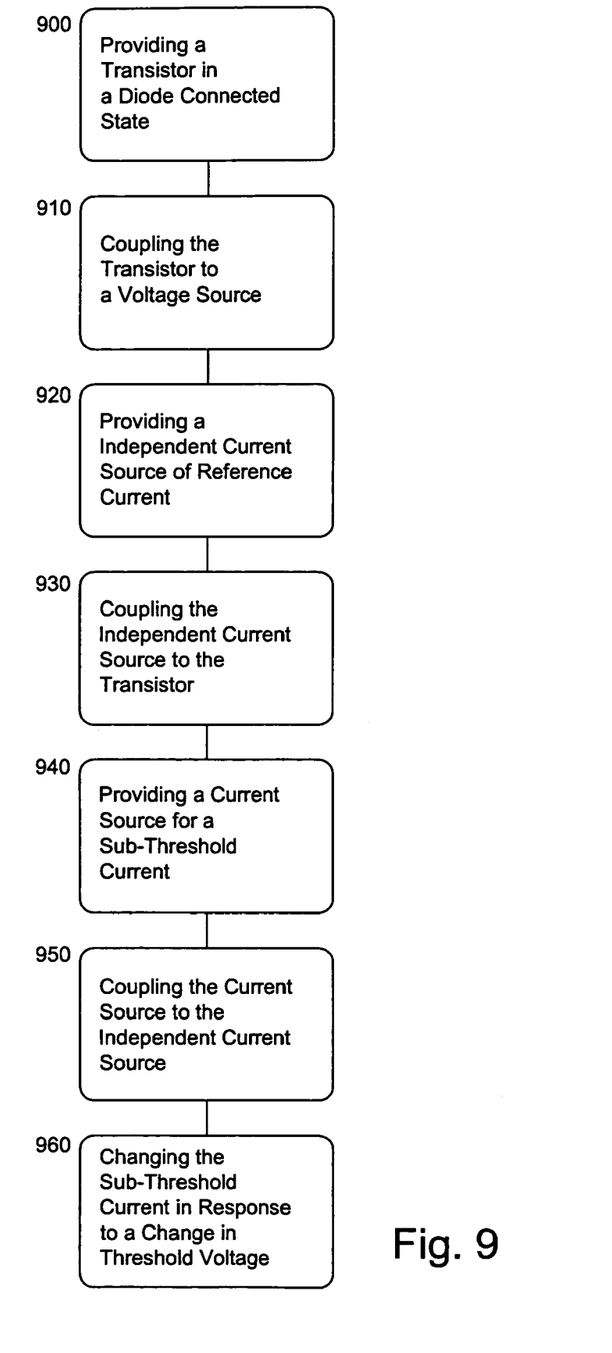
FIG. 9 is a representative flow chart of a method for P.V.T compensation for a chip line voltage.

In the operation of an exemplary embodiment, referring to FIG. 9, on chip line voltage with adequate process-voltage-temperature (PVT) compensation may be provided by providing transistor 501 (FIG. 5) configured in a diode-connected state, step 900; coupling transistor 501 to voltage source 10 (FIG. 5) which will be compensated, step 910; providing bias independent source 700 (FIG. 5) which will provide a reference current $I_{REF}$, step 920; coupling bias independent source 700 to transistor 501, step 930; providing source 600 of a sub-threshold current $I_{sbt}$, step 940, where source 600 comprises bias independent source 701 (FIG. 6) of reference current $I_{REF}$ and transistor 602 (FIG. 6) adapted to be driven into a saturation state; coupling source 600 to bias independent source 700, step 950; and allowing a change in the sub-threshold current $I_{sbt}$ in response to a change in threshold voltage, step 960.

In this method, decreasing threshold voltage results in an increase in the current $I_{sbt}$ and increasing threshold voltage results in a decrease in the sub threshold current $I_{sbt}$.

An aspect of the present disclosure is a circuit that generates desirable word line voltage levels for varied environment of process, voltage and temperature variations. This allows the word line voltage levels to be responsive to more than just temperature.

Another aspect of the present disclosure is the generation of environmentally independent and insensitive $V_{PP}$ and $V_{BB}$ voltage levels by selection of the coefficients C1, C2 and D1 and D2 respectively. The lower the Coefficients C2 and D2 the more insensitive $V_{PP}$ and $V_{BB}$ are to environmental variations. Conversely the greater the coefficients C2 and D2 the more sensitive $V_{PP}$ and $V_{BB}$ become to environmental variations.

Still another aspect of the present disclosure is that it may be implement in any kind of process including low voltage processes and is a simple circuit that is easy to implement.

It will be understood that various changes in the details, materials, and arrangements of the parts which have been described and illustrated above in order to explain the nature of this present disclosure may be made by those skilled in the art without departing from the principle and scope of the present disclosure as recited in the appended claims.

What is claimed is:

1. A circuit for providing a controlled voltage level, comprising:
    a PMOS transistor coupled to a first voltage coupler ($V_{PP}$), the gate of the PMOS transistor being coupled to the drain of the PMOS transistor;
    a MOS sub-threshold current source, coupled to a second voltage coupler (ground); and
    a bias independent current source coupled to the MOS sub-threshold current source and the PMOS transistor intermediate the MOS sub-threshold current source and the PMOS transistor.

2. The circuit of claim 1, further comprising an inhibit terminal coupled intermediate the bias independent current source and the MOS sub-threshold current source.

3. The circuit of claim 1, wherein the first voltage coupler (Vpp) is adapted to be coupled to a source of Vpp voltage.

4. The circuit of claim 1, wherein the second voltage coupler is adapted to be coupled to ground.

5. The circuit of claim 1, wherein the MOS sub-threshold current source comprises a source of Ippc current.

6. The circuit of claim 1, wherein the MOS sub-threshold current source further comprises:
    A third voltage coupler;
    a resistor, comprising a first terminal coupled to the third voltage coupler and a second terminal;
    a second bias independent current source coupled to the second terminal of the resistor;
    a PMOS transistor, the source of which is coupled to the third voltage coupler and the gate of which is coupled to the second terminal of the resistor;
    a third bias independent current source coupled to the drain of the PMOS transistor;
    a first NMOS transistor, the drain of which is coupled to the drain of the PMOS transistor and to the gate of the first NMOS transistor and the source of which is coupled to the second voltage coupler; and
    a second NMOS transistor, the gate of which is coupled to the gate of the first NMOS transistor, the source of which is coupled to the second voltage couple, and the drain of which is coupled to the bias independent current source for providing a source of Ippc current.

7. The circuit of claim 6, wherein the first voltage coupler is adapted to couple to a source of $V_{PP}$ voltage.

8. The circuit of claim 6, wherein each bias independent current source further comprises:
    a fourth voltage coupler;
    a reference resistor, comprising a first terminal coupled to the fourth voltage coupler and a second terminal;
    a first PMOS transistor, the source of which is coupled to the second terminal of the reference resistor;
    a second PMOS transistor, the gate of which is coupled to the gate of the first PMOS transistor and to the drain of the second PMOS transistor and the source of which is coupled to the fourth voltage coupler;
    a first NMOS transistor, the drain and gate of which are coupled to the drain of the first PMOS transistor and the source of which is coupled to a fifth voltage coupler; and
    a second NMOS transistor, the drain of which is coupled to the drain of the second PMOS transistor, the gate of which is coupled to the gate of the first NMOS transistor, and the source of which is coupled to the fourth voltage coupler.

9. The circuit of claim 8, wherein the fourth voltage coupler is adapted to couple to a source of voltage.

10. The circuit of claim 1, wherein the bias independent current source further comprises:
    a third voltage coupler;
    a reference resistor, comprising a first terminal coupled to the third voltage coupler and a second terminal;
    a first PMOS transistor, the source of which is coupled to the second terminal of the reference resistor;
    a second PMOS transistor, the gate of which is coupled to the gate of the first PMOS transistor and to the drain of the second PMOS transistor and the source of which is coupled to the third voltage coupler;
    a first NMOS transistor, the drain and gate of which are coupled to the drain of the first PMOS transistor and the source of which is coupled to a second voltage coupler; and
    a second NMOS transistor, the drain of which is coupled to the drain of the second PMOS transistor, the gate of which is coupled to the gate of the first NMOS transistor, and the source of which is coupled to the fourth voltage coupler.

11. The circuit of claim 10, wherein the third voltage coupler is adapted to couple to a source of voltage.

12. A bias Voltage (VBB) detection circuit, comprising:
    a first voltage source;
    a source of bbc current, comprising a first terminal coupled to the first voltage source and a second terminal;
    a bias independent current source, comprising a first terminal coupled to the second terminal of the source of bbc current and a second terminal; and
    a PMOS transistor, the source of which is coupled to the second terminal of the bias independent current source, the gate of which is coupled to the drain, and the drain of which is coupled to a second voltage source.

13. A method for providing on chip line voltage with adequate pressure-voltage-temperature compensation, comprising:
    providing a transistor (501) configured in a diode-connected state;
    coupling the transistor (501) to a voltage source to be compensated ($V_{PP}$);
    providing a bias independent source (700) of reference current (Iref);
    coupling the bias independent source (700) of reference current (Iref) to the transistor (501);
    providing a source (600) of a sub-threshold current (Isbt), the source (600) of the sub-threshold current (Isbt) comprising a second bias independent source (700) of reference current (Iref) and a transistor (602) adapted to be driven into a saturation state;
    coupling the source (600) of the sub-threshold current (Isbt) to the bias independent source (700) of reference current (Iref); and allowing a change in the sub-threshold current (Isbt) in response to a change in threshold voltage.

14. The method of claim 13, wherein:

a decrease in threshold voltage results in an increase in the sub-threshold current (Isbt); and an increase in threshold voltage results in a decrease in the sub-threshold current (Isbt).

15. The method of claim 13, further comprising:

providing an inhibit coupler intermediate the bias independent source (700) of reference current (Iref) and the source (600) of the sub-threshold current (Isbt);

allowing the voltage source to be compensated ($V_{PP}$) to rise in response to a rise in sub-threshold current (Isbt);

allowing the voltage source to be compensated ($V_{PP}$) to fall in response to a fall in sub-threshold current (Isbt); and using the inhibit coupler to provide a reference signal to detect a value of the voltage at the voltage source to be compensated ($V_{PP}$).

16. The method of claim 15, wherein a high value at the inhibit coupler indicates that the voltage at the voltage source to be compensated ($V_{PP}$) has reached a desired value.

* * * * *